United States Patent
Nagai et al.

(10) Patent No.: US 9,240,391 B2
(45) Date of Patent: Jan. 19, 2016

(54) SEMICONDUCTOR DEVICE

(71) Applicant: Panasonic Corporation, Osaka (JP)

(72) Inventors: Noriyuki Nagai, Nara (JP); Shigefumi Dohi, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/140,653

(22) Filed: Dec. 26, 2013

(65) Prior Publication Data

US 2014/0103543 A1  Apr. 17, 2014

Related U.S. Application Data

(63) Continuation of application No. PCT/JP2012/006052, filed on Sep. 24, 2012.

(30) Foreign Application Priority Data

Jan. 30, 2012 (JP) .................... 2012-016633

(51) Int. Cl.
*H01L 25/00* (2006.01)
*H01L 23/00* (2006.01)
*H01L 25/065* (2006.01)

(52) U.S. Cl.
CPC ............... *H01L 25/00* (2013.01); *H01L 24/17* (2013.01); *H01L 24/19* (2013.01); *H01L 25/0657* (2013.01); *H01L 24/13* (2013.01); *H01L 24/16* (2013.01); *H01L 24/32* (2013.01); *H01L 24/73* (2013.01); *H01L 25/50* (2013.01); *H01L 2224/0401* (2013.01); *H01L 2224/04105* (2013.01); *H01L 2224/12105* (2013.01);

(Continued)

(58) Field of Classification Search
CPC ........ H01L 27/06; H01L 21/822; H01L 24/18
USPC ................................. 257/685; 2/685
See application file for complete search history.

(56) References Cited

U.S. PATENT DOCUMENTS 7,649,250 B2 * 1/2010 Park .............................. 257/690
7,807,512 B2 10/2010 Lee et al.

(Continued)

FOREIGN PATENT DOCUMENTS

| JP | 2001-250836 | 9/2001 |
|---|---|---|
| JP | 2004-140037 | 5/2004 |
| JP | 2004-146728 | 5/2004 |
| JP | 2008-251912 | 10/2008 |

(Continued)

OTHER PUBLICATIONS

International Search Report of PCT Application No. PCT/JP2012/006052 dated Dec. 18, 2012.

*Primary Examiner* — Matthew W Such
*Assistant Examiner* — Krista Soderholm
(74) *Attorney, Agent, or Firm* — Panasonic Patent Center

(57) ABSTRACT

A semiconductor device includes: a first semiconductor chip; a second semiconductor chip placed such that a front face of the second semiconductor chip faces a front face of the first semiconductor chip, and being smaller in size than the first semiconductor chip; an expansion portion extending outward from at least one side face of the second semiconductor chip; a wiring board placed such that a front face of the wiring board faces the front face of the first semiconductor chip and a back face of the second semiconductor chip; and a first interconnect formed on the back face of the second semiconductor chip and a back face of the expansion portion, and being in connection to the wiring board.

15 Claims, 6 Drawing Sheets

(52) U.S. Cl.
CPC ............... *H01L2224/13016* (2013.01); *H01L 2224/13147* (2013.01); *H01L 2224/13155* (2013.01); *H01L 2224/1403* (2013.01); *H01L 2224/14181* (2013.01); *H01L 2224/16145* (2013.01); *H01L 2224/16225* (2013.01); *H01L 2224/1703* (2013.01); *H01L 2224/17051* (2013.01); *H01L 2224/17181* (2013.01); *H01L 2224/32145* (2013.01); *H01L 2224/32225* (2013.01); *H01L 2224/73203* (2013.01); *H01L 2224/73204* (2013.01); *H01L 2224/73259* (2013.01); *H01L 2225/06513* (2013.01); *H01L 2225/06517* (2013.01); *H01L 2225/06548* (2013.01); *H01L 2225/06568* (2013.01); *H01L 2924/12042* (2013.01); *H01L 2924/15192* (2013.01); *H01L 2924/15311* (2013.01)

(56) References Cited

U.S. PATENT DOCUMENTS

| | | | |
|---|---|---|---|
| 8,519,537 B2* | 8/2013 | Jeng et al. | 257/738 |
| 8,890,628 B2* | 11/2014 | Nair et al. | 331/68 |
| 2004/0070064 A1 | 4/2004 | Yamane et al. | |
| 2004/0145051 A1* | 7/2004 | Klein et al. | 257/734 |
| 2006/0267186 A1 | 11/2006 | Tanida et al. | |
| 2008/0237883 A1 | 10/2008 | Tago et al. | |
| 2010/0044845 A1* | 2/2010 | Funaya et al. | 257/685 |

FOREIGN PATENT DOCUMENTS

| | | |
|---|---|---|
| JP | 2010-74194 | 4/2010 |
| WO | 20051124857 | 12/2005 |

* cited by examiner

SEMICONDUCTOR DEVICE

This is a continuation of International Application No. PCT/JP2012/006052 filed on Sep. 24, 2012, which claims priority to Japanese Patent Application No. 2012-016633 filed on Jan. 30, 2012. The entire disclosures of these applications are incorporated by reference herein.

BACKGROUND

The present disclosure relates to semiconductor devices, and in particular, to a chip-on-chip (CoC) semiconductor device.

There is an increasing demand that semiconductor devices decrease in size and thickness while providing improved performance. As an example of semiconductor devices meeting the demand, CoC semiconductor devices, in which functional surfaces of chips are joined by means of joint members such as bumps, have become widespread. In the CoC semiconductor devices, it is possible to increase the speed of signal control between upper and lower chips and to combine chips having been produced by different processes. The CoC semiconductor devices thus have high versatility.

Japanese Unexamined Patent Publication No. 2004-146728 describes a CoC semiconductor device.

The conventional semiconductor device described in Japanese Unexamined Patent Publication No. 2004-146728 includes a motherboard, a first chip placed above the motherboard, and a second chip placed above the first chip.

The first chip is in connection to the second chip through solder bumps. The second chip (i.e. the upper chip) is larger in size than the first chip (i.e. the lower chip), and has the peripheral portion projecting laterally relative to the side faces of the first chip. The projecting peripheral portion of the second chip is in connection to the motherboard through solder electrodes.

The function of the first chip is utilized from the motherboard through the solder bumps connecting the first chip to the second chip, interconnects within the second chip, and the solder electrodes connecting the second chip to the motherboard. The function of the second chip is utilized from the motherboard through the solder electrodes connecting the second chip to the motherboard.

SUMMARY

The conventional semiconductor device, however, has the following disadvantage.

In the conventional semiconductor device, the both of the functions of the first and second chips are utilized from the motherboard through the solder electrodes.

However, since the motherboard has a small wiring resource and little flexibility in interconnect formation, it is impossible to arrange interconnects on the motherboard to an extent sufficient to correspond to the functions of the first and second chips utilized from the mother motherboard. Accordingly, performance of the semiconductor device is adversely reduced.

It is therefore an object of the present disclosure to improve performance of a CoC semiconductor device by increasing a wiring resource through which functions of semiconductor chips are utilized.

To achieve the object, a semiconductor device of the present disclosure includes: a first semiconductor chip; a second semiconductor chip placed such that a front face of the second semiconductor chip faces a front face of the first semiconductor chip, and being smaller in size than the first semiconductor chip; an expansion portion extending outward from at least one side face of the second semiconductor chip; a wiring board placed such that a front face of the wiring board faces the front face of the first semiconductor chip and a back face of the second semiconductor chip; and a first interconnect formed on the back face of the second semiconductor chip and a back face of the expansion portion, and being in connection to the wiring board.

In a CoC semiconductor device according to the present disclosure, a wiring resource through which functions of the chips are utilized is increased. Thus, the performance of the semiconductor device can be improved.

DETAILED DESCRIPTION

Figure 1:
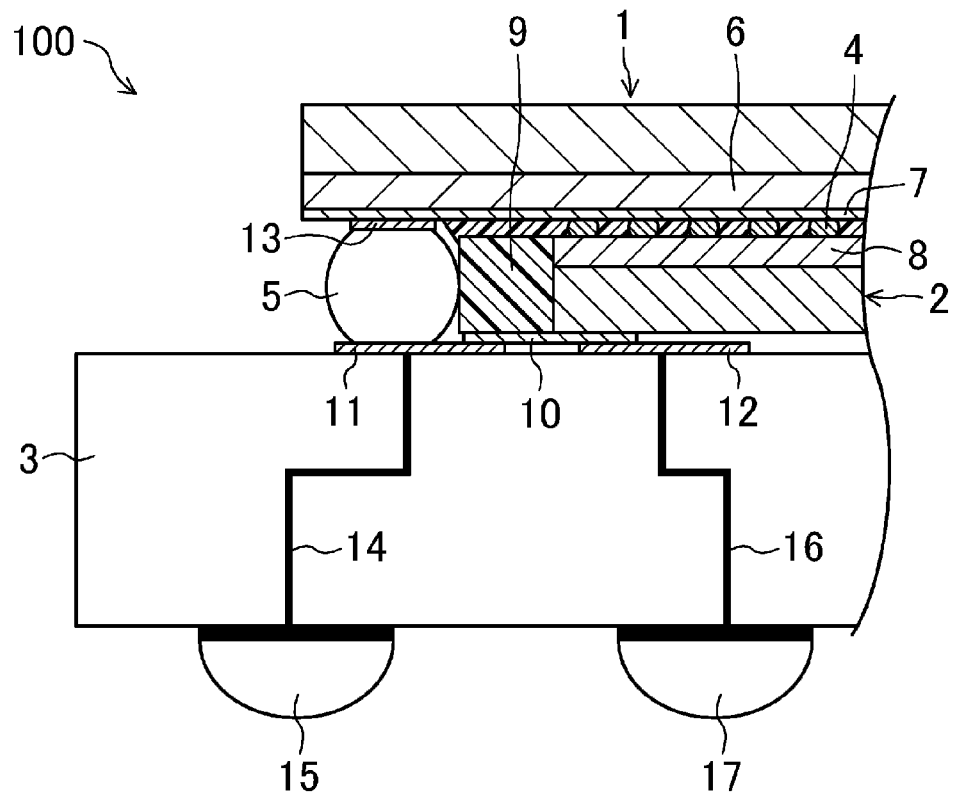
FIG. 1 is a cross-sectional view schematically illustrating a semiconductor device according to Embodiment 1 of the present disclosure.

Embodiments of a semiconductor device according to the present disclosure will be described below with reference to the drawings. The same components are denoted by the same reference characters throughout the drawings, and the description of the same components are not repeated as appropriate.

(Embodiment 1)

FIG. 1 is a cross-sectional view schematically illustrating part of a semiconductor device 100 according to this embodiment.

The semiconductor device 100 includes a semiconductor chip 1 which is a first semiconductor chip, a semiconductor chip 2 which is a second semiconductor chip, an expansion portion 9, and a wiring board 3. The semiconductor chip 2 is placed on the wiring board 3. The semiconductor chip 1 is stacked on the semiconductor chip 2 and placed above the wiring board 3. The semiconductor chip 1 is in connection to the semiconductor chip 2 through bumps 4. The semiconductor chip 1 is in connection to the wiring board 3 through bumps 5.

The semiconductor chip 1 includes at least one circuit 6 formed on a silicon substrate and having an electrical characteristic function, and a re-distribution layer (RDL) 7 formed on and connected to the circuit 6. The semiconductor chip 1 further includes, on a front face, a plurality of input/output pads 13 formed on a peripheral portion and each being in electrical connection to the wiring board 3, and a plurality of input/output pads (not shown) formed in a central portion and each being in electrical connection to the semiconductor chip 2. In the present disclosure, "the front face of the semiconductor chip 1" refers to the face on which the RDL 7 is located.

With this configuration, the function of the semiconductor chip 1 can be utilized from the wiring board 3 through the RDL 7, the input/output pads 13, and the bumps 5.

The semiconductor chip 2 includes at least one circuit 8 formed on a silicone substrate and having an electrical characteristic function. The semiconductor chip 2 further includes, on a front face, a plurality of input/output pads (not shown) each being in electrical connection to the semiconductor chip 1. In the present disclosure, the "front face of the semiconductor chip 2" refers to the face on which the circuit 8 is located.

The semiconductor chip 2 is smaller in size than the semiconductor chip 1. The front face of the semiconductor chip 2 faces the front face of the semiconductor chip 1.

The expansion portion 9 is in contact with at least one side face of the semiconductor chip 2 and extends outward from the at least one side face of the semiconductor chip 2. The expansion portion 9 is insulative and made of resin, for example. The semiconductor chip 2 and the expansion portion 9 together form an expanded semiconductor chip. The expanded semiconductor chip is smaller in size than the semiconductor chip 1, and the peripheral portion of the semiconductor chip 1 projects laterally relative to at least one side face of the expanded semiconductor chip.

The semiconductor device 100 further includes interconnects 10 which are first interconnects. The interconnects 10 are located on a back face of the expanded semiconductor chip (specifically, on back faces of the semiconductor chip 2 and the expansion portion 9), and extend from a peripheral portion of the semiconductor chip 2 to overlap the expansion portion 9. The interconnects 10 are in connection to the wiring board 3. In the present disclosure, the "back face of the expanded semiconductor chip" refers to the face which faces the wiring board 3.

With this configuration, the function of the semiconductor chip 2 can be utilized from the wiring board 3 through the bumps 4, the RDL 7, the input/output pads 13, and the bumps 5.

The wiring board 3 includes a plurality of lands 11 and 12 formed on a front face, a plurality of external terminals 15 and 17 formed on a back face, and a plurality of interconnect paths 14 and 16 formed within the wiring board 3.

The front face of the wiring board 3 faces the front face of the semiconductor chip 1 and the back face of the semiconductor chip 2. In the present disclosure, the "front face of the wiring board 3" refers to the face on which the lands 11 and 12 are located.

The interconnect paths 14 connect the lands 11 to the external terminals 15. The interconnect paths 16 connect the lands 12 to the external terminals 17.

The lands 11 are in connection to the input/output pads 13 of the semiconductor chip 1 through the bumps 5. The lands 11 are also in connection to parts of the interconnects 10. The lands 12 are in connection to other parts of the interconnects 10. Specifically, in each of the interconnects 10, the part being in connection to the corresponding one of the lands 12 is different from the part being in connection to the corresponding one of lands 11. The connections between the interconnects 10 and the lands 11 and 12 can be established by, e.g., applying conductive paste (not shown) to the interconnects 10 or the lands 11 and 12. Alternatively, the connections between the interconnects 10 and the lands 11 and 12 can be established by, e.g., vibrating the interconnects 10 and the lands 11 and 12 while keeping the interconnects 10 and the lands 11 and 12 in contact with one another.

With this configuration, the functions of the semiconductor chips 1 and 2 can be utilized from the external terminals 15 through the lands 11 and the interconnect paths 14 extending within the wiring board 3, and from the external terminals 17 through the lands 12 and the interconnect paths 16 extending within the wiring board 3.

In the semiconductor device according to this embodiment, in which the front faces of the semiconductor chips 1 and 2 face each other and the peripheral portion of the semiconductor chip 1 projects laterally relative to the at least one side face of the semiconductor chip 2, the RDL 7 of the semiconductor chip 1 can be used for utilization of the function of the semiconductor chip 1. Further, the RDL 7 of the semiconductor chip 1 can also be used for utilization of the function of the semiconductor chip 2. It is preferable to form the RDL 7 on a wafer from which the semiconductor chip 1 is singulated. In this manner, the RDL 7 can be formed more efficiently as compared to a case where the RDL is formed on the singulated semiconductor chip 1.

Further, it is possible to use the interconnects 10 for utilization of the functions of the semiconductor chips 1 and 2. This use of the interconnects 10 results in increase in the wiring resource, and accordingly, in improvement of the flexibility in formation of the interconnects for utilization of the functions of the chips. The increase in the wiring resource and the improvement of the flexibility in the interconnect formation enable the semiconductor device to decrease in size and thickness and to provide improved performance.

(Variation 1 of Embodiment 1)

Figure 2:
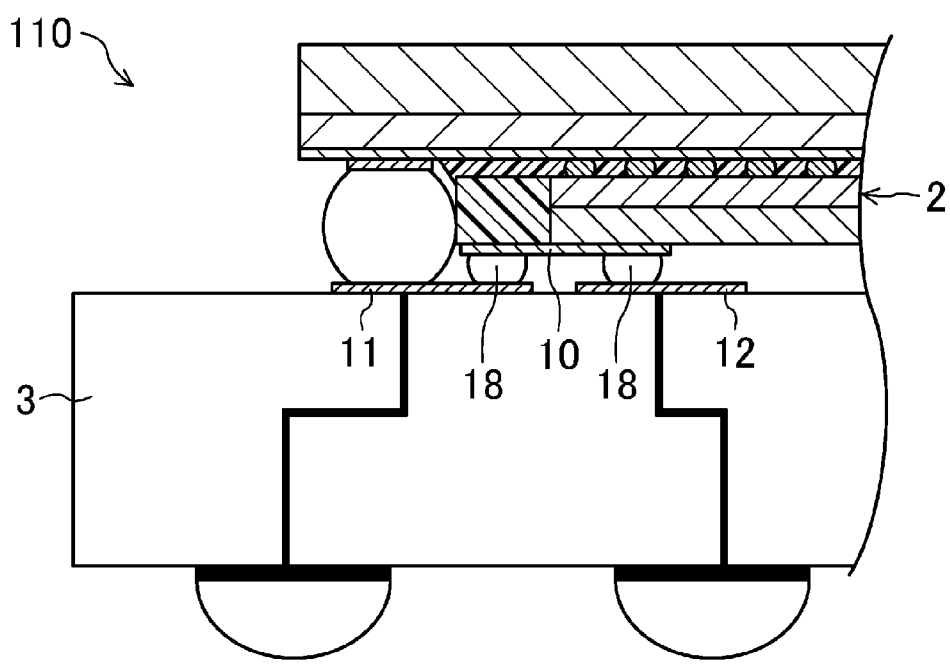
FIG. 2 is a cross-sectional view schematically illustrating a semiconductor device according to Variation 1 of Embodiment 1.

FIG. 2 is a cross-sectional view schematically illustrating a semiconductor device 110 according to this variation. For the sake of simplicity, reference characters 1, 4-9, and 13-17 are omitted from FIG. 2.

As illustrated in FIG. 2, the semiconductor device 110 includes bumps 18, in addition to the components of Embodiment 1. The bumps 18 are interposed between the interconnects 10 and the lands 11 and 12 of the wiring board 3. The wiring board 3 is in connection to the interconnects 10 through the bumps 18.

With this configuration, the thickness of the semiconductor chip 2 can be reduced. Further, the distance between the semiconductor chip 2 and the wiring board 3 is increased, thereby facilitating heat dissipation from the semiconductor chip 2. Furthermore, the connections between the interconnects 10 and the lands 11 and 12 can be maintained more stably by the bumps 18.

(Variation 2 of Embodiment 1)

Figure 3:
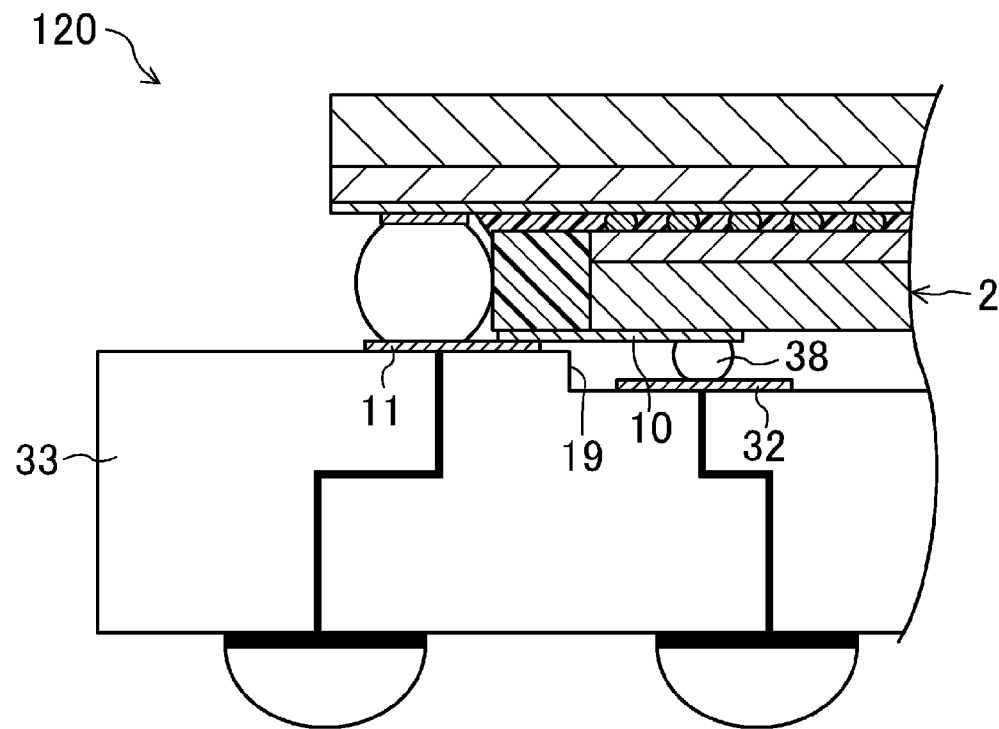
FIG. 3 is a cross-sectional view schematically illustrating a semiconductor device according to Variation 2 of Embodiment 1.

FIG. 3 is a cross-sectional view schematically illustrating a semiconductor device 120 according to this variation. For the sake of simplicity, reference characters 1, 4-9, and 13-17 are omitted from FIG. 3.

As illustrated in FIG. 3, the semiconductor device 120 includes a wiring board 33 instead of the wiring board 3 of Embodiment 1, and further has bumps 38 in addition to the components of Embodiment 1. The wiring board 33 includes lands 32 instead of the lands 12 of Embodiment 1.

On a front face of the wiring board 33, a step 19 is provided in such a manner that the region in which the lands 11 are located is at a higher level than the region in which the lands 32 are located (i.e., the region under the semiconductor chip 2). In other words, on the front face of the wiring board 33, a recess is formed in the region under the semiconductor chip 2, and the lands 32 are located on the bottom surface of the recess. The bumps 38 are interposed between the lands 32 of the wiring board 33 and the interconnects 10.

With this configuration, the distance between the semiconductor chip 2 and the wiring board 33 is increased, thereby facilitating heat dissipation from the semiconductor chip 2. The heat dissipation can be further improved by equipping the semiconductor chip 2 with a heat-dissipating member.

(Variation 3 of Embodiment 1)

Figure 4:
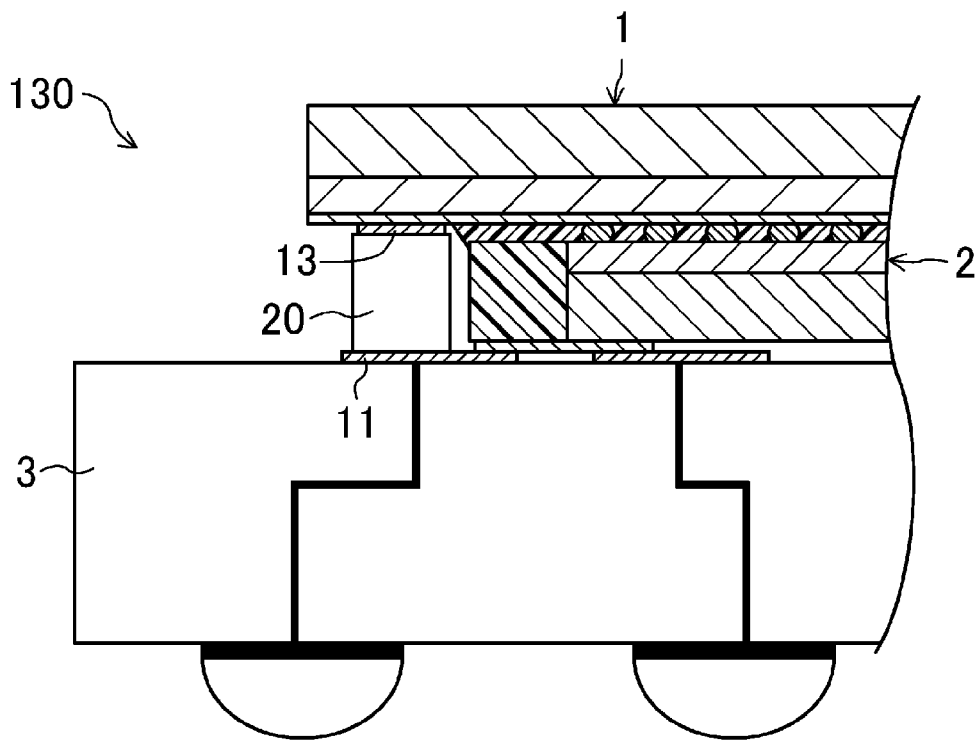
FIG. 4 is a cross-sectional view schematically illustrating a semiconductor device according to Variation 3 of Embodiment 1.

FIG. 4 is a cross-sectional view schematically illustrating a semiconductor device 130 according to this variation. For the sake of simplicity, reference characters 4, 6-10, 12, and 14-17 are omitted from FIG. 4.

As illustrated in FIG. 4, the semiconductor device 130 includes pillars 20 instead of the bumps 5 of Embodiment 1. The pillars 20 are interposed between the lands 11 of the wiring board 3 and the input/output pads 13 of the semiconductor chip 1. The wiring board 3 is in connection to the semiconductor chip 1 through the pillars 20.

This variation includes, as joint members, the pillars 20 in a columnar shape, instead of the bumps. Use of the pillars 20 as the joint members makes it easy to adjust the width of the joint members in accordance with the areas of joint portions of the lands 11 and joint portions of the input/output pads 13. It also becomes easy to adjust the height of the joint members in accordance with the thickness of the semiconductor chip 2. Specifically, when the thickness of the semiconductor chip 2 is reduced, only the height of the pillars 20 can be easily reduced while maintaining the areas of the joint portions of the lands 11 and the input/output pads 13, thereby easily enabling reduction of the thickness of the semiconductor device. In the present disclosure, the "joint portion of the land 11" refers to a portion of each of the lands 11 which is in connection to the corresponding joint member. The "joint portion of the input/output pad 13" refers to a portion of each of the input/output pads 13 which is in connection to the corresponding joint member.

It is further possible to reduce the areas of the joint portions of the lands 11 and the input/output pads 13 as compared to a case where the bumps are used. Thus, the size of the semiconductor device can be reduced.

(Embodiment 2)

Figure 5:
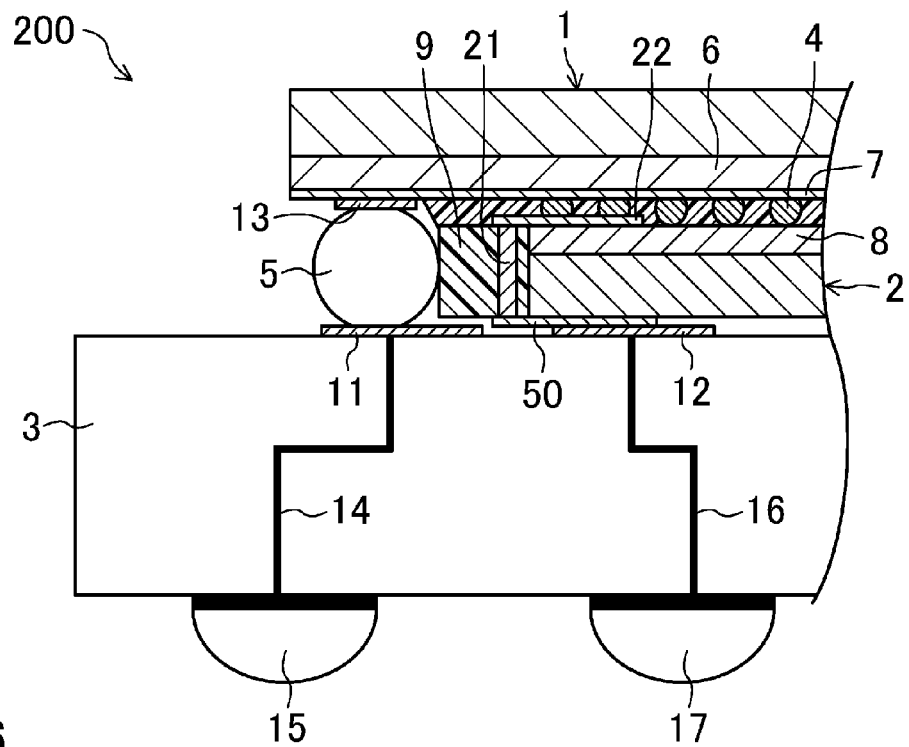
FIG. 5 is a cross-sectional view schematically illustrating a semiconductor device according to Embodiment 2 of the present disclosure.

FIG. 5 is a cross-sectional view schematically illustrating part of a semiconductor device 200 according to this embodiment. The semiconductor device 200 of this embodiment will be described below while focusing on the differences between the semiconductor device 200 and the semiconductor device 100 of Embodiment 1. The description of the same components is not repeated.

The semiconductor device 200 includes vias 21 which are first vias, and interconnects 22 which are second interconnects, in addition to the components of Embodiment 1. The semiconductor device 200 also includes interconnects 50 instead of the interconnects 10 of Embodiment 1.

The vias 21 are formed in the expansion portion 9, and penetrate the expansion portion 9 in a direction perpendicular to the front face of the wiring board 3. The interconnects 22 are located on the front face of the expanded semiconductor chip (in other words, on the front faces of the semiconductor chip 2 and the expansion portion 9), and extend from the peripheral portion of the semiconductor chip 2 to overlap the expansion portion 9. The interconnects 50 are located on the back face of the expanded semiconductor chip (in other words, on the back faces of the semiconductor chip 2 and the expansion portion 9), and extend from the peripheral portion of the semiconductor chip 2 to overlap the expansion portion 9.

The vias 21 connect the interconnects 50 to the interconnects 22. The interconnects 22 are in connection to the input/output pads (not shown) of the semiconductor chip 2. With this configuration, the interconnects 22 can be used for utilization of the function of the semiconductor chip 2. Further, the interconnects 22 are in connection to the RDL 7 of the semiconductor chip 1 through the bumps 4. With this configuration, the interconnects 22 can be used for utilization of the function of the semiconductor chip 1. The interconnects 50 are in connection to the lands 12 of the wiring board 3.

According to this embodiment, the semiconductor device 200 further includes the vias 21 and the interconnects 22, and has the interconnects 50 instead of the interconnects 10 of Embodiment 1. With this configuration, the number of the paths through which the functions of the semiconductor chips 1 and 2 are utilized from the wiring board 3 is increased, resulting in an increase in the wiring resource. Thus, the performance of the semiconductor device can be improved.

As a consequence of the increase in the wiring resource, the semiconductor device can be further reduced in size and thickness by, e.g., removing interconnects which prevent reduction of size and thickness of the device.

In a manner similar to variation 1 of Embodiment 1, the semiconductor device of this embodiment may include bumps interposed between the interconnects 50 and the lands 12. In this manner, the advantages as described in Variation 1 of Embodiment 1 can be obtained.

In a manner similar to Variation 2 of Embodiment 1, the semiconductor device of this embodiment may be configured such that, on the front face of the wiring board, a recess is formed in a region under the semiconductor chip 2, and bumps are interposed between lands located on the bottom surface of the recess and the interconnects 50. In this manner, the advantages as described in Variation 2 of Embodiment 1 can be obtained.

In a manner similar to Variation 3 of Embodiment 1, the semiconductor device of this embodiment may include pillars instead of the bumps. In this manner, the advantages as described in Variation 3 of Embodiment 1 can be obtained.

(Embodiment 3)

Figure 6:
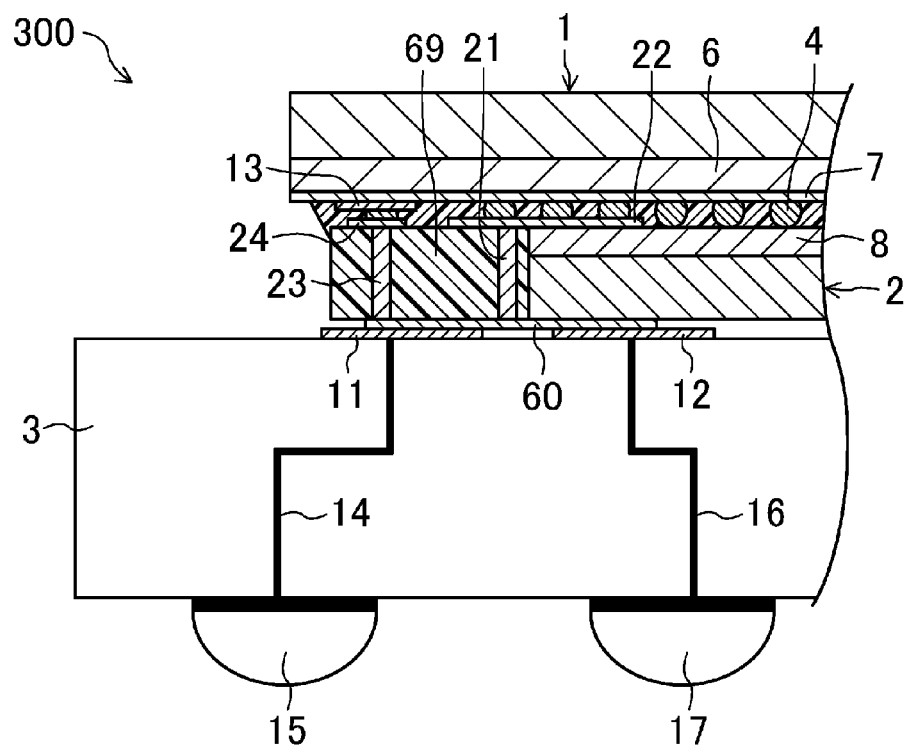
FIG. 6 is a cross-sectional view schematically illustrating a semiconductor device according to Embodiment 3 of the present disclosure.

FIG. 6 is a cross-sectional view schematically illustrating part of a semiconductor device 300 according to this embodiment. The semiconductor device 300 of this embodiment will be described below while focusing on the differences between the semiconductor device 300 and the semiconductor device 200 of Embodiment 2. The description of the same components is not repeated.

The semiconductor device 300 includes vias 23 which are second vias and interconnects 24 which are third interconnects, in addition to the components of Embodiment 2. The semiconductor device 300 also includes expansion portion 69 instead of the expansion portion 9 of Embodiment 2, interconnects 60 instead of the interconnects 50 of Embodiment 2, and additional bumps 4 interposed between the interconnects 24 and the input/output pads 13. The expansion portion 69 and the semiconductor chip 2 together form an expanded semiconductor chip.

The vias 23 are formed in the expansion portion 69, and penetrate the expansion portion 69 in a direction perpendicular to the front face of the wiring board 3. The vias 23 are located outward relative to the vias 21. The interconnects 24 are located on the front face of the expansion portion 69. It is preferable that the interconnects 24 and the interconnects 22 are formed in a simultaneous manner.

The expansion portion 69 projects further laterally as compared to the expansion portion 9 of Embodiment 2. The interconnects 60 are located on the back face of the expanded semiconductor chip (in other words, on the back faces of the semiconductor chip 2 and the expansion portion 69), and extend from the peripheral portion of the semiconductor chip 2 to overlap the expansion portion 69.

The vias 21 connect the interconnects 60 to the interconnects 22. The vias 23 connect the interconnects 60 to the interconnects 24. The interconnects 60 are in connection to the lands 11 and 12 of the wiring board 3. The interconnects 24 are in connection to the input/output pads 13 of the semiconductor chip 1 through the additional bumps 4.

In Embodiment 2, the input/output pads 13 of the semiconductor chip 1 are in connection to the lands 11 of the wiring board 3 through the bumps 5. On the other hand, in this embodiment, the input/output pads 13 of the semiconductor chip 1 are in connection to the lands 11 of the wiring board 3 through the additional bumps 4, the interconnects 24, the vias 23, and the interconnects 60. Thus, the semiconductor device 300 of this embodiment does not include the bumps 5 of Embodiment 2.

According to this embodiment, the functions of the semiconductor chips 1 and 2 can be utilized through the vias 23, and not through the bumps 5. Accordingly, the bumps 5 no longer need to be formed, and the fabrication process is simplified. In addition, the size of the semiconductor device can be reduced by designing the vias 23 to have a width smaller than that of the bumps.

(Variation 1 of Embodiment 3)

Figure 7:
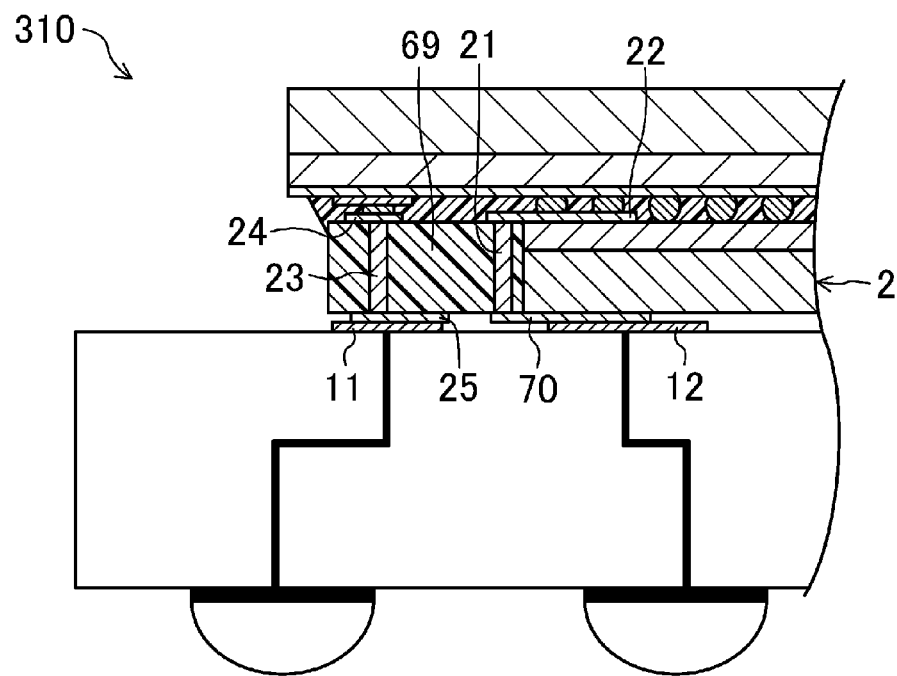
FIG. 7 is a cross-sectional view schematically illustrating a semiconductor device according to Variation 1 of Embodiment 3.

FIG. 7 is a cross-sectional view schematically illustrating a semiconductor device 310 according to this variation. For the sake of simplicity, reference characters 1, 3, 4, 6-8, and 13-17 are omitted from FIG. 7.

As illustrated in FIG. 7, the semiconductor device 310 includes interconnects 25 which are fourth interconnects, in addition to the components of Embodiment 3. The semiconductor device 310 also includes interconnects 70 instead of the interconnects 60 of Embodiment 3.

The interconnects 25 are located on the back face of the expansion portion 69. The interconnects 70 are located on the back face of the extended semiconductor chip (in other words, on the back faces of the semiconductor chip 2 and the expansion portion 69), and extend from the peripheral portion of semiconductor chip 2 to overlap the expansion portion 69.

The vias 21 connects the interconnects 70 to the interconnects 22. The vias 23 connect the interconnects 25 to the interconnects 24. The interconnects 70 are in connection to the lands 12 of the wiring board 3. The interconnects 25 are in connection to the lands 11 of the wiring board 3.

With this configuration, each of the lands 11 and the lands 12 serves as a separate path for utilization of the functions of the chips. Consequently, the flexibility in the interconnect formation is increased, and the electrical characteristics of the semiconductor device are improved.

(Variation 2 of Embodiment 3)

Figure 8:
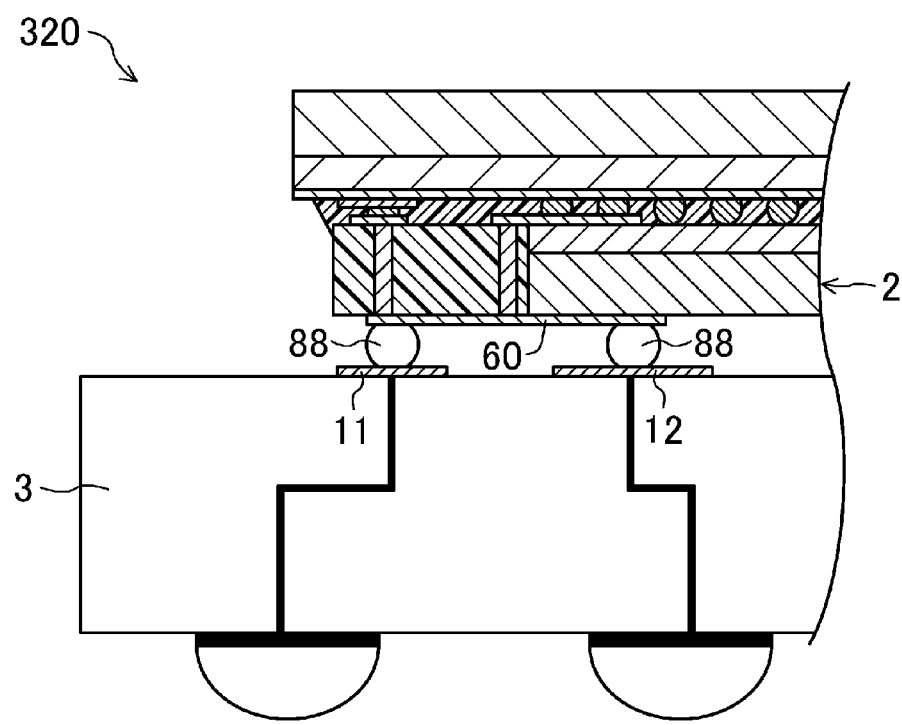
FIG. 8 is a cross-sectional view schematically illustrating a semiconductor device according to Variation 2 of Embodiment 3.

FIG. 8 is a cross-sectional view schematically illustrating a semiconductor device 320 according to this variation. For the sake of simplicity, reference characters 1, 4, 6-8, 13-17, 21-24, and 69 are omitted from FIG. 8.

As illustrated in FIG. 8, the semiconductor device 320 includes bumps 88 in addition to the components of Embodiment 3. The bumps 88 are interposed between the interconnects 60 and the lands 11 and 12 of the wiring board 3. The wiring board 3 is in connection to the interconnects 60 through the bumps 88.

With this configuration, the distance between the semiconductor chip 2 and the wiring board 3 is increased, thereby facilitating heat dissipation from the semiconductor chip 2. The heat dissipation can be further improved by equipping the semiconductor chip 2 with a heat-dissipating member.

<Fabrication Method of Semiconductor Device of Embodiment 1>

FIGS. 9-12 illustrate an example of the fabrication method of the semiconductor device 100 of Embodiment 1.

Figure 9:
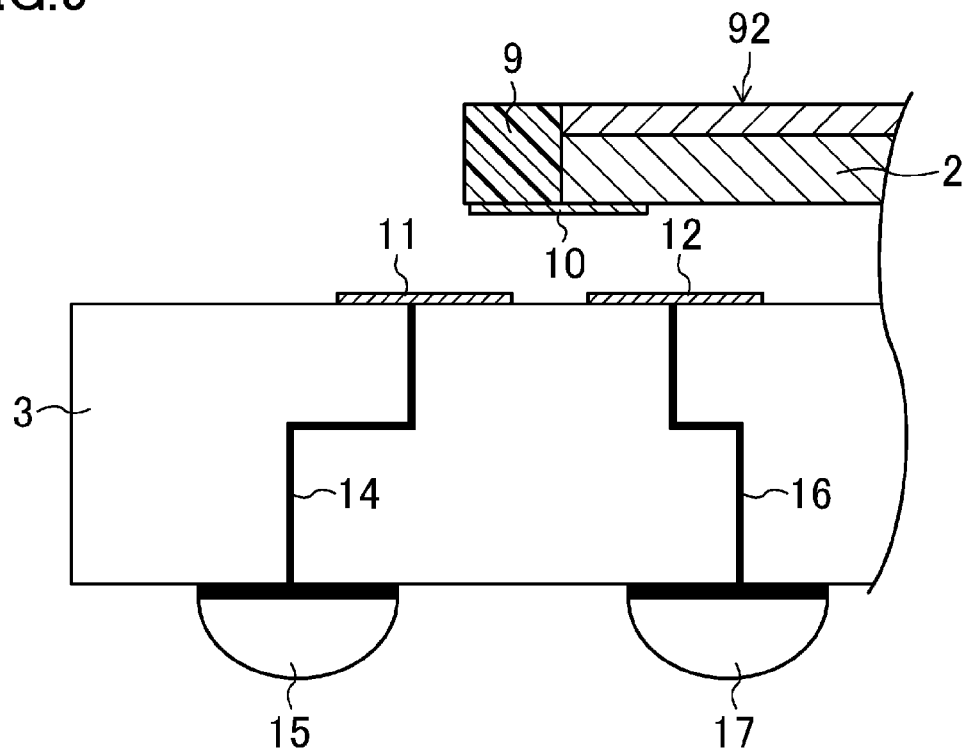
FIG. 9 is a cross-sectional view schematically illustrating an example of a fabrication process of the semiconductor device according to Embodiment 1.

First, an expanded semiconductor chip 92 is prepared. As illustrated in FIG. 9, the expanded semiconductor chip 92 includes input/output pads (not shown) on the front face and the interconnects 10 located on the back face and extending from the peripheral portion of the semiconductor chip 2 to overlap the expansion portion 9.

The wiring board 3 is prepared next. The wiring board 3 includes the lands 11 and 12 on the front face, the external terminals 15 and 17 on the back face, and the interconnect paths 14 and 16 therewithin.

Figure 10:
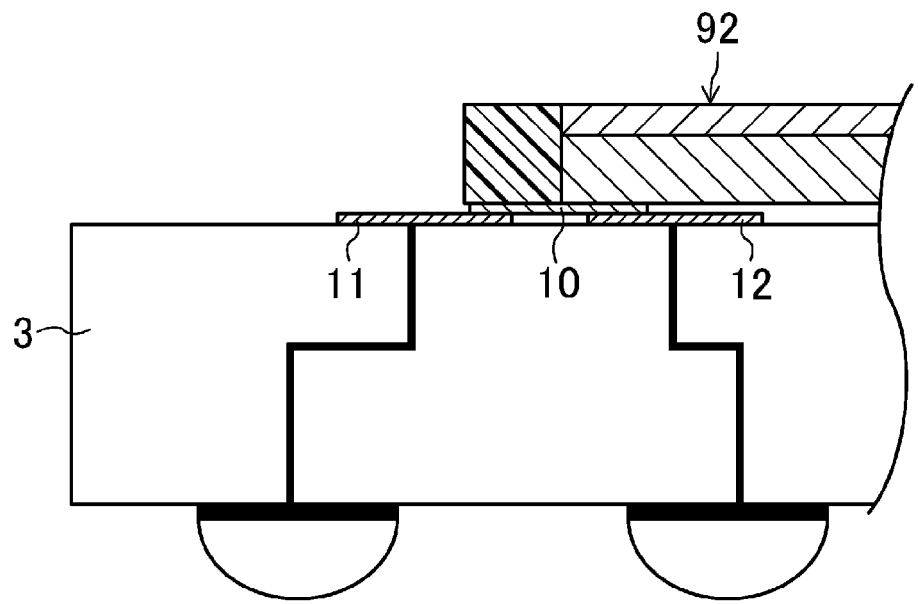
FIG. 10 is a cross-sectional view schematically illustrating the example of the fabrication process of the semiconductor device according to Embodiment 1.

Next, as illustrated in FIG. 10, the expanded semiconductor chip 92 is placed above the wiring board 3 such that the interconnects 10 are connected to the lands 11 and 12. The expanded semiconductor chip 92 and the wiring board 3 may be adhered to each other by inserting an adhesive member between the expanded semiconductor chip 92 and the wiring board 3.

Figure 11:
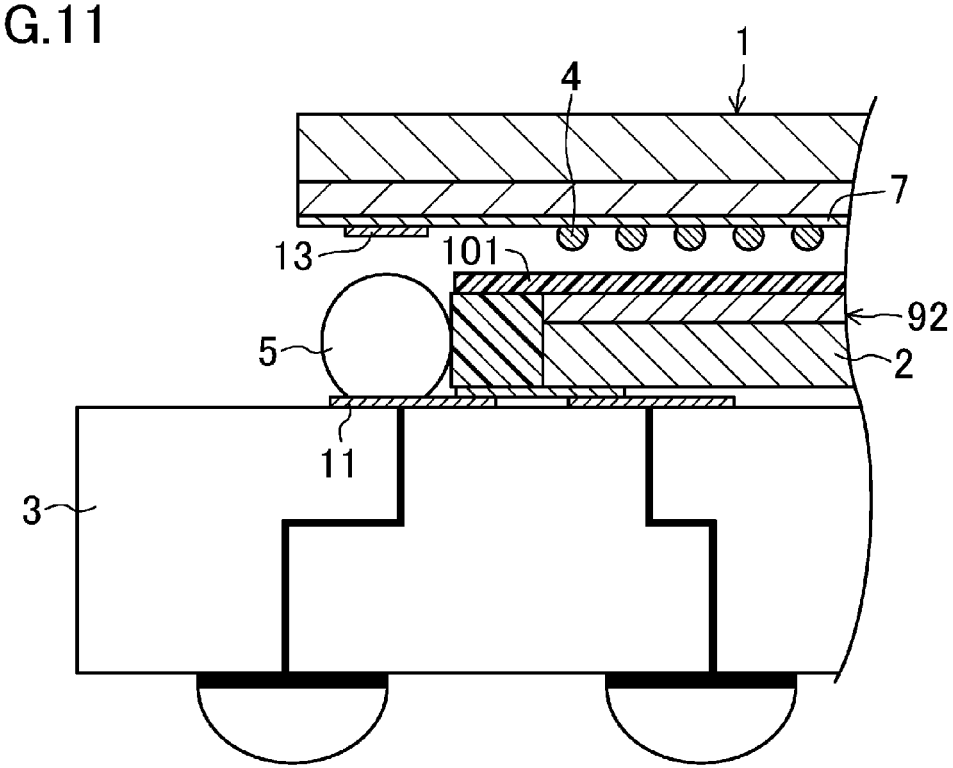
FIG. 11 is a cross-sectional view schematically illustrating the example of the fabrication process of the semiconductor device according to Embodiment 1.

As illustrated in FIG. 11, the semiconductor chip 1 is prepared next. The semiconductor chip 1 includes the plurality of input/output pads 13 for electrical connection to the wiring board 3, the plurality of input/output pads (not shown) for electrical connection to the semiconductor chip 2, and the bumps 4 formed on the input/output pads (not shown).

Next, the bumps 5 are formed on the lands 11 of the wiring board 3 such that the uppermost point of each of the bumps 5 is positioned higher than the front face of the semiconductor chip 2. The bumps 5 can be formed by, e.g., electrolytic plating, mounting, or printing.

Next, a resin sheet material 101 is applied to the front face of the expanded semiconductor chip 92.

Next, semiconductor chip 1 is positioned above the wiring board 3 having the expanded semiconductor chip 92 placed thereon, such that the input/output pads 13 face the bumps 5 and the bumps 4 face the input/output pads (not shown) of the semiconductor chip 2.

Figure 12:
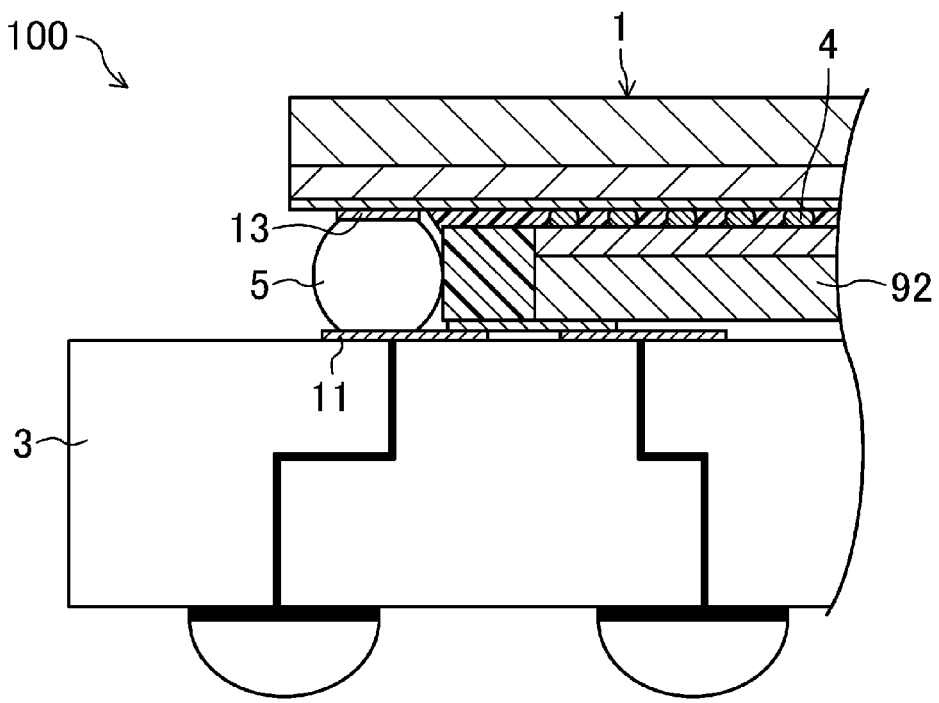
FIG. 12 is a cross-sectional view schematically illustrating the example of the fabrication process of the semiconductor device according to Embodiment 1.

Finally, as illustrated in FIG. 12, the semiconductor chip 1 is stacked above the expanded semiconductor chip 92, and accordingly, placed above the wiring board 3. At this time, the input/output pads 13 of the semiconductor chip 1 are joined to the bumps 5. Consequently, the connections between the lands 11 of the wiring board 3 and the input/output pads 13 of the semiconductor chip 1 are established through the bumps 5. In addition, the bumps 4 are joined to the input/output pads (not shown) of the semiconductor chip 2. Consequently, the connections between the input/output pads (not shown) of the semiconductor chip 1 and the input/output pads (not shown) of the semiconductor chip 2 are established through the bumps 4. This CoC junction is formed by, e.g., controlled collapse chip connection process (C4 process) or scrubbing.

The semiconductor device 100 can be fabricated in the above-described manner.

Instead of the application of the resin sheet material 101 to the front face of the expanded semiconductor chip 92 prior to placement of the semiconductor chip 1, an underfill resin may be injected between the semiconductor chip 1 and the semiconductor chip 2 after placement of the semiconductor chip 1.

In Embodiments 1-3 and the variations thereof, the RDL 7 and the interconnects 10, 50, 60, 70, 22, and 25 may be larger in width and thickness than fine interconnects formed by diffusion process in the circuits 6 and 8 of the semiconductor chip 1 and 2. In that case, the thicknesses of the RDL 7 and the interconnects 10, 50, 60, 70, 22, and 25 are 3-20 µm. With this configuration, the RDL 7 and the interconnects 10, 50, 60, 70, 22, and 25 can have resistance smaller than the fine interconnects. Consequently, it is possible to supply power more stably when the RDL 7 and/or the interconnects 10, 50, 60, 70, 22, and 25 are used as interconnects for power supply.

The plurality of bumps 4 are preferably arranged at intervals of 100 µm or less. The bumps 4 are made of a metal such as solder, copper (Cu), or nickel (Ni).

The bumps 5 and the pillars 20 are made of a metal such as Cu.

In order to ensure connection reliability, the lands 11 of the wiring board 3 are preferably located immediately under the input/output pads 13 of the semiconductor chip 1. In order to increase the flexibility in the interconnect formation, all of the lands 12 of the wiring board 3 are preferably located immediately under the semiconductor chip 2.

Each of the expansion portions 9 and 69 is made of, e.g., epoxy resin.

The vias 21 and 23 are formed by the following process, for example. Through holes are formed in the expansion portion by, e.g., irradiating the expansion portion with laser light, and then, the through holes are filled with solder or Cu.

The present invention has been detailed above with reference to Embodiments 1-3 and the variations thereof. The present invention, however, is not limited to the embodiments and the like. Changes or modifications may be made without departing from the scope of the invention. For example, the scope of the present invention includes combinations of the embodiments, and the embodiments in which any part of the components is replaced with an equivalent which is not referred to in the embodiments and the like.

The present invention can increase the wiring resource of a semiconductor device and thereby can improve performance of the semiconductor device. The present invention is widely applicable to electronic equipment including CoC semiconductor devices.

What is claimed is:

1. A semiconductor device comprising:
    a first semiconductor chip;
    a second semiconductor chip placed such that a front face of the second semiconductor chip faces a front face of the first semiconductor chip, and being smaller in size than the first semiconductor chip;
    an expansion portion extending outward from at least one side face of the second semiconductor chip;
    a wiring board placed such that a front face of the wiring board faces the front face of the first semiconductor chip and a back face of the second semiconductor chip; and
    a first interconnect formed on the back face of the second semiconductor chip and a back face of the expansion portion, extending linearly from a portion of the second semiconductor chip to overlap the expansion portion, wherein
    the first interconnect is in connection to the wiring board via two separate lands in parallel.

2. The semiconductor device of claim 1, wherein on the front face of the wiring board, a recess is formed in a region under the second semiconductor chip.

3. The semiconductor device of claim 1, wherein the first semiconductor chip is in connection to the wiring board through a pillar.

4. The semiconductor device of claim 1, wherein the first interconnect is in connection to the wiring board through a bump.

5. The semiconductor device of claim 1, further comprising:
    a first via penetrating the expansion portion; and
    a second interconnect formed on the front face of the second semiconductor chip and a front face of the expansion portion, and being in connection to the first semiconductor chip through a bump, wherein
    the first via connects the first interconnect to the second interconnect.

6. The semiconductor device of claim 5, further comprising:
    a second via penetrating the expansion portion;
    a third interconnect formed on the front face of the expansion portion and being in connection to the first semiconductor chip through a bump; and
    a fourth interconnect formed on the back face of the expansion portion and being in connection to the wiring board, wherein
    the second via connects the third interconnect to the fourth interconnect.

7. The semiconductor device of claim 5, further comprising:
    a second via penetrating the expansion portion; and
    a third interconnect formed on the front face of the expansion portion and being in connection to the first semiconductor chip through a bump, wherein
    the second via connects the first interconnect to the third interconnect.

8. The semiconductor device of claim 7, wherein the first interconnect is in connection to the wiring board through a bump.

9. A semiconductor device comprising:
    a first semiconductor chip;
    a second semiconductor chip placed such that a front face of the second semiconductor chip faces a front face of the first semiconductor chip, and being smaller in size than the first semiconductor chip;
    an expansion portion extending outward from at least one side face of the second semiconductor chip;
    a wiring board placed such that a front face of the wiring board faces the front face of the first semiconductor chip and a back face of the second semiconductor chip;
    a first interconnect formed on the back face of the second semiconductor chip and a back face of the expansion portion, extending linearly from a portion of the second semiconductor chip to overlap the expansion portion, and being in connection to the wiring board;
    a first via penetrating the expansion portion;
    a second via penetrating the expansion portion;
    a second interconnect formed on the front face of the second semiconductor chip and a front face of the expansion portion, and being in connection to the first semiconductor chip through a first bump and the second semiconductor chip;

a third interconnect formed on the front face of the expansion portion and being in connection to the first semiconductor chip through a second bump; and a fourth interconnect formed on the back face of the expansion portion and being in connection to the wiring board, wherein the first via connects the first interconnect to the second interconnect, the second via connects the third interconnect to the fourth interconnect, and the second via is arranged outward relative to the first via.

10. The semiconductor device of claim 9, wherein on the front face of the wiring board, a recess is formed in a region under the second semiconductor chip.

11. The semiconductor device of claim 9, wherein the first semiconductor chip is in connection to the wiring board through a pillar.

12. The semiconductor device of claim 9, wherein the first interconnect is in connection to the wiring board through a bump.

13. A semiconductor device comprising:

a first semiconductor chip;

a second semiconductor chip placed such that a front face of the second semiconductor chip faces a front face of the first semiconductor chip, and being smaller in size than the first semiconductor chip;

an expansion portion extending outward from at least one side face of the second semiconductor chip;

a wiring board placed such that a front face of the wiring board faces the front face of the first semiconductor chip and a back face of the second semiconductor chip;

a first interconnect formed on the back face of the second semiconductor chip and a back face of the expansion portion, extending from a portion of the second semiconductor chip to overlap the expansion portion, and being in connection to the wiring board;

a first via penetrating the expansion portion;

a second interconnect formed on the front face of the second semiconductor chip and a front face of the expansion portion, and being in connection to the first semiconductor chip through a first bump and the second semiconductor chip;

a third interconnect formed on the front face of the expansion portion and being in connection to the first semiconductor chip; and a fourth interconnect formed on the back face of the expansion portion and being in connection to the wiring board, wherein the first via connects the first interconnect to the second interconnect, the first semiconductor chip is in connection to the wiring board through a second bump or a pillar, and the second bump or the pillar is arranged outward relative to the first via.

14. The semiconductor device of claim 13, wherein on the front face of the wiring board, a recess is formed in a region under the second semiconductor chip.

15. The semiconductor device of claim 13, wherein the first interconnect is in connection to the wiring board through a bump.

* * * * *